(12) United States Patent
Kumaki

(10) Patent No.: US 7,340,364 B1
(45) Date of Patent: Mar. 4, 2008

(54) TEST APPARATUS, AND CONTROL METHOD

(75) Inventor: Norio Kumaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/546,926

(22) Filed: Oct. 12, 2006

(51) Int. Cl.
G06F 19/00 (2006.01)
G06F 11/00 (2006.01)

(52) U.S. Cl. ...................... 702/118; 714/736

(58) Field of Classification Search ........ 702/118–123; 716/4; 714/724, 736, 738; 370/241; 717/100, 717/124
See application file for complete search history.

(56) References Cited

U.S. PATENT DOCUMENTS

| | | | | |
|---|---|---|---|---|
| 4,354,268 A | * | 10/1982 | Michel et al. | 714/724 |
| 5,168,216 A | * | 12/1992 | Dance | 714/736 |
| 5,414,639 A | * | 5/1995 | Sugimoto et al. | 716/4 |
| 5,812,424 A | * | 9/1998 | Chikyu | 361/191 |
| 6,259,647 B1 | * | 7/2001 | Ooishi | 365/230.01 |
| 6,499,121 B1 | * | 12/2002 | Roy et al. | 714/724 |
| 6,577,979 B1 | * | 6/2003 | Okitaka | 702/117 |
| 6,584,592 B2 | * | 6/2003 | Omura et al. | 714/733 |
| 6,622,272 B1 | * | 9/2003 | Haverkamp et al. | 714/725 |
| 6,671,653 B2 | * | 12/2003 | Sato et al. | 702/181 |
| 6,671,844 B1 | * | 12/2003 | Krech et al. | 714/736 |
| 6,728,652 B1 | * | 4/2004 | Kobayashi | 702/117 |
| 6,804,620 B1 | * | 10/2004 | Larson et al. | 702/91 |
| 6,868,513 B1 | * | 3/2005 | Botala et al. | 714/738 |
| 6,922,650 B2 | * | 7/2005 | Sato | 702/120 |
| 6,966,018 B2 | * | 11/2005 | Hilliges | 714/724 |
| 6,988,232 B2 | * | 1/2006 | Ricchetti et al. | 714/736 |
| 7,197,417 B2 | * | 3/2007 | Pramanick et al. | 702/119 |
| 7,209,851 B2 | * | 4/2007 | Singh et al. | 702/119 |

FOREIGN PATENT DOCUMENTS

JP 11-64450 3/1999

OTHER PUBLICATIONS

Mueller et al., Architecture Drives Test System Standards, Sep. 2000, IEEE Spectrum, pp. 68-73.*
Rajsuman et al., Architecture and Design of an Open ATE to Incubate the Development of Third-Party Instruments, Oct. 2005, IEEE Transactions on Instrumentation and Measurement, vol. 54, No. 5, pp. 1678-1698.*

* cited by examiner

*Primary Examiner*—Michael Nghiem
*Assistant Examiner*—Toan M. Le
(74) *Attorney, Agent, or Firm*—Osha Liang LLP

(57) ABSTRACT

There is provided a test apparatus that tests a device under test. The test apparatus includes a control processor that executes a test program for testing the device under test, a test unit that is connected to the device under test and tests the device under test according to an instruction from the control processor, and a relay section that is connected to the control processor and the test unit and relays a control instruction sent from the control processor to the test unit. The relay section includes a polling section that repeatedly reads a status register showing a state of the test unit, which is designated by the control processor, and a process control section that sends the control instruction to be processed by the test unit after a value of the status register becomes an expected value to the test unit according to the fact that the value of the status register becomes the expected value designated by the control processor.

7 Claims, 10 Drawing Sheets

TEST APPARATUS, AND CONTROL METHOD

BACKGROUND

1. Field of the Invention

The present invention relates to a test apparatus and a control method. More particularly, the present invention relates to a test apparatus and a control method for sending an instruction for control from a control processor to a test unit in order to control the test unit that tests a device under test.

2. Related Art

A control processor provided in a test apparatus operates based on an installed control program and sends an instruction to a test unit. In this way, it is possible to control the test unit, for example, to appropriately start the test unit or to change a setting for the test unit under an operation.

However, a sequence of instructions to be processed is determined according to a specification in the test unit, and when an execution sequence of the instructions is contrary to the specification, it is concerned that the test unit and a device under test are damaged. For this reason, a programmer makes the control program so as to execute the instructions in a sequence based on this specification.

Moreover, a timing at which the instructions should be executed is determined according to the specification in the test unit. For example, a certain instruction is determined to be executed at a timing at which the test unit enters a predetermined state. A method for detecting such a state change includes polling by a control processor or interrupt-handling for a control processor from a test unit.

The polling by a control processor means a process by which the control processor regularly reads a value of a register in the test unit and detects a state change by means of the change of value. However, since the process reading a value from the register has a long time distance in comparison to an instruction execution by the control processor and an input-output waiting time occurs for the control processor, computing powers of the control processor may not be effectively used.

On the other hand, when trying to realize interrupt handling, each test unit needs a mechanism for realizing the interrupt handling, and thus it is concerned that a whole design of the test apparatus is complicated. Furthermore, when trying to quickly detect interrupt, presence or absence of the interrupt should be confirmed at high frequency, and thus it is concerned that an operating system for controlling interrupt increases a processing load of the control processor.

In this manner, when trying to quickly and appropriately detect the state change of the test unit, the control processor requires high computing powers. For this reason, although the test apparatus includes a plurality of test units, control processors are needed every test unit and thus a number of control processors are mounted in the test apparatus. The increase of the number of the control processors results in jumboization of the test apparatus and a cooling apparatus and the increase of cost, and then may cause the increase of an incidence rate of failure of the test apparatus.

In addition, as a reference technique related to a semiconductor test apparatus, the Japanese Patent Application Publication No. 1999-64450 can be referred to.

SUMMARY

Therefore, it is an object of some aspects of the present invention to provide a test apparatus and a control method that can solve the foregoing problems. The above and other objects can be achieved by combinations described in the independent claims. The dependent claims define further advantageous and exemplary combinations of the present invention.

That is, according to an aspect of the present invention, there is provided a test apparatus that tests a device under test. The test apparatus includes: a control processor that executes a test program for testing the device under test; a test unit that is connected to the device under test and tests the device under test according to an instruction from the control processor; and a relay section that is connected to the control processor and the test unit and relays a control instruction sent from the control processor to the test unit, and the relay section includes: a polling section that repeatedly reads a status register showing a state of the test unit, which is designated by the control processor; and a process control section that sends the control instruction to be processed by the test unit after a value of the status register becomes an expected value to the test unit according to the fact that the value of the status register becomes the expected value designated by the control processor.

Moreover, the control processor may write the expected value and an address of the status register within an address space assigned to the test unit to an address assigned to the relay section and then writes the control instruction to an address assigned to the test unit, the relay section may further have a buffer section that sequentially buffers a condition writing command for writing the address of the status register and the expected value and a control instruction writing command for writing the instruction command, which are received from the control processor, the polling section may repeatedly issue a reading command of which reading address is the address of the status register to the test unit in response to acquiring the condition writing command from the buffer section, and the process control section may include a buffer control section that sends the control instruction writing command received later than the condition writing command to the test unit according to the fact that the value of the status register becomes the expected value.

Moreover, the control processor may write a masking value designating whether each bit of the value of the status register read from the polling section is masked or not and an after-masking expected value showing a value to be satisfied by a value of the masked status register, as the expected value when writing the address of the status register and the expected value, and the buffer control section may send the control instruction writing command received later than the condition writing command to the test unit according to the fact that a value masked from the value of the status register by the masking value becomes the after-masking expected value.

Moreover, the control processor may sequentially write, when the control instruction is sent to the test unit on condition that a first of the status register becomes a first of the expected value and a second of the status register becomes a second of the expected value, an address of the first status register and a first expected value and an address of the second status register and a second expected value to an address assigned to the relay section and then writes the control instruction to an address assigned to the test unit, the polling section may repeatedly issue a first reading command of which reading address is the address of the first status register to the test unit in response to acquiring a first of the condition writing command for writing the address of the first status register and the first expected value from the buffer section, the buffer control section may fetch a second of the condition writing command, which is received later than the first condition writing command, for writing the address of the second status register and the second expected value from the buffer section according to the fact that a value of the first status register becomes the first expected value, the polling section may repeatedly issue a second reading command of which reading address is the address of the second status register to the test unit in response to acquiring the second condition writing command from the buffer section, and the buffer control section may send the control instruction writing command received later than the second condition writing command to the test unit according to the fact that a value of the second status register becomes the second expected value.

Moreover, the process control section may issue time-out interrupt to the control processor according to the elapse of a preset time-out time after the acquirement of the condition writing command from the buffer section.

Moreover, the process control section may issue interrupt to the control processor in order to make the control processor send a following control instruction according to the fact that the value of the status register becomes the expected value designated by the control processor.

Moreover, according to another aspect of the present invention, there is provided a control method for controlling a test apparatus. The test apparatus includes: a control processor that executes a test program for testing a device under test; and a test unit that is connected to the device under test and tests the device under test according to an instruction from the control processor, and the control method includes: repeatedly reading a status register showing a state of the test unit, which is designated by the control processor; and sending a control instruction to be processed by the test unit after a value of the status register becomes an expected value to the test unit according to the fact that the value of the status register becomes the expected value designated by the control processor.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
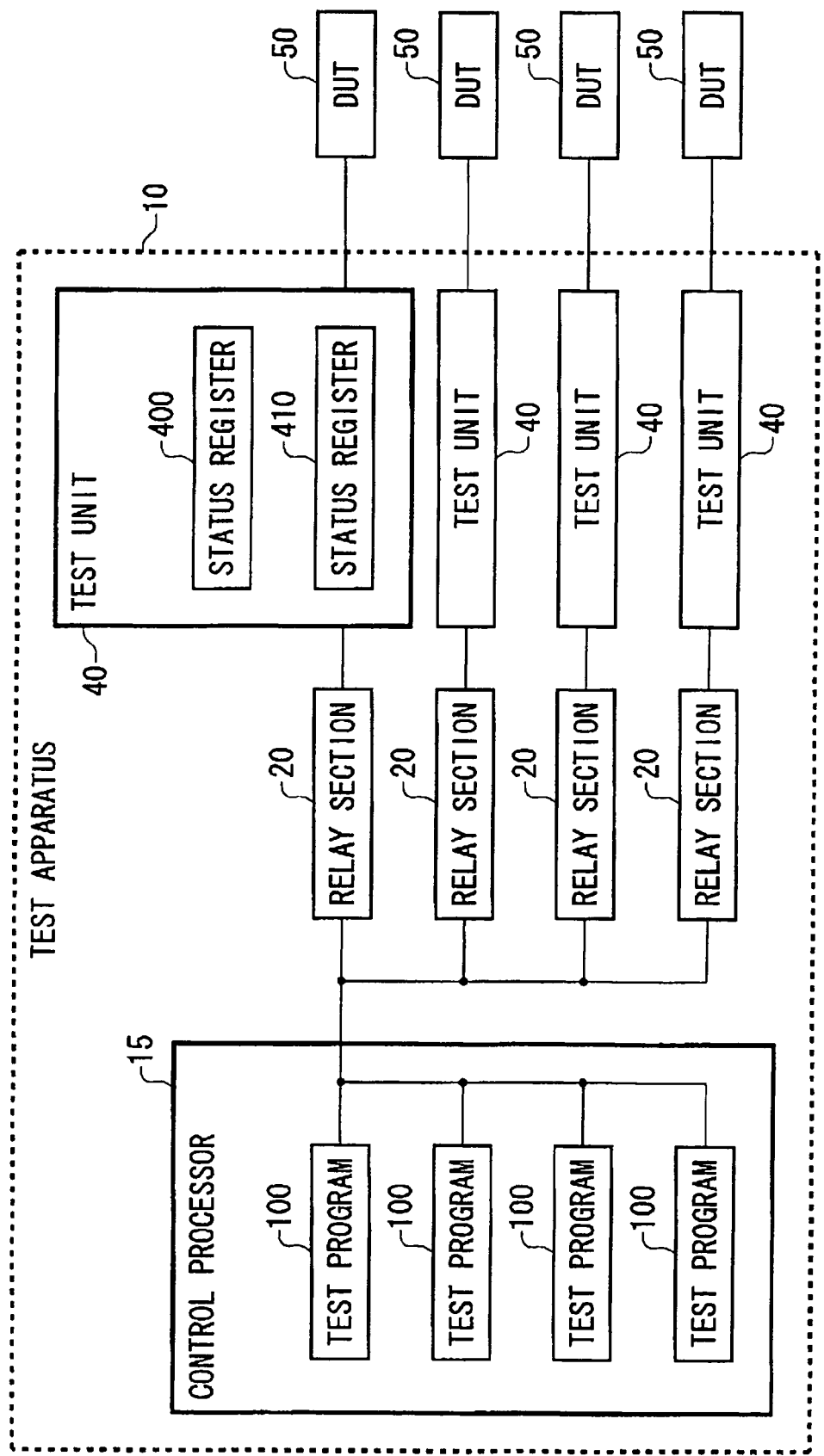
FIG. 1 is a view showing an entire configuration of a test apparatus.

FIG. 1 is a view showing an entire configuration of a test apparatus 10. The test apparatus 10 has a control processor 15, a plurality of relay sections 20, and a plurality of test units 40. The control processor 15 executes a test program 100 for testing a device under test. The control processor 15 may execute a plurality of test programs 100 for controlling the test units 40 different from one another. Each of the plurality of test programs 100 may be executed in parallel by time-sharing a computer resource of the control processor 15 in an operating system including execution mechanism referred to as a multitask, a multi-process, or a multithread.

Each of the plurality of test units 40 is provided corresponding to each of a plurality of devices under test 50. Then, each of the plurality of test units 40 is connected to the corresponding device under test 50 and tests the device under test 50 according to an instruction from the control processor 15. Moreover, the plurality of test units 40 respectively has a status register showing a state of each test unit 40. For example, each of the plurality of test units 40 has a status register 400 that is an example of a first status register and a status register 410 that is an example of a second status register. Even though the status registers 400 and 410 only for one test unit 40 are exemplified in the present drawing, each of the other test units 40 may also have a status register. Then, the plurality of test units 40 respectively stores a state of each test unit 40 on these status registers according to a state change by the advance of test.

Each of the plurality of relay sections 20 is provided corresponding to each of the plurality of test units 40. Each of the plurality of relay sections 20 is connected to the control processor 15 and the corresponding test unit 40. Then, each of the plurality of relay sections 20 relays a control instruction sent from the control processor 15 to the corresponding test unit 40. Specifically, a storage area within the relay section 20 and a storage area within the test unit 40 are mapped on a virtual address space on which the test program 100 operates by the control processor 15. Then, the control processor 15 executes a writing command in the test program 100 to perform writing on the virtual address space, i.e., the relay section 20 or the test unit 40. In addition, the control instruction for the test unit 40 may be an instruction for setting and changing frequency of a signal for test, an instruction for instructing the start of an operation of a test sequence, or the like, in addition to an instruction for setting and changing the size of voltage to be applied to the device under test 50 from the test unit 40 or the like.

The relay section 20 receives writing data on the address space assigned to the test unit 40 from the control processor 15, and transfers the received data themselves to the test unit 40. On the other hand, with regard to writing data on the address space assigned to the relay section 20, the relay section 20 performs a writing process on a register, a memory, or the like in this relay section 20 according to the contents. The relay section 20 controls a timing transferring an instruction according to the written contents. For example, the relay section 20 may send data such as a control instruction received next these writing data to the test unit 40 after waiting a time shown by these writing data.

In this manner, the test apparatus 10 according to the present embodiment controls a timing at which a command is sent to the test unit 40 by means of the relay section 20 separately provided with the control processor 15. In this way, it is an object to reduce a load processing the control processor 15 and accurately control a timing sending a control instruction.

Subsequently, a functional configuration of one certain relay section 20 among the plurality of relay sections 20 will be explained.

Figure 2:
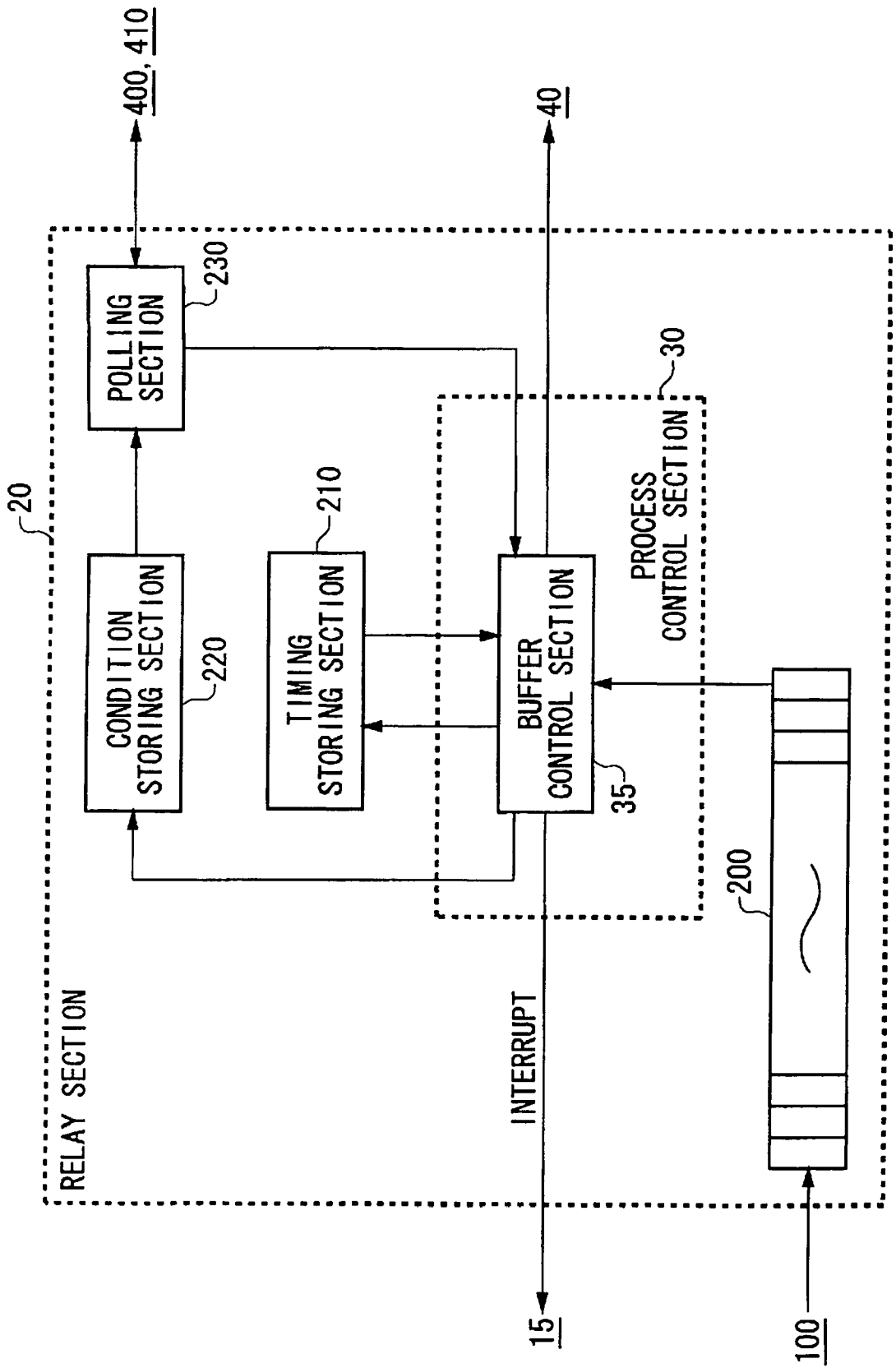
FIG. 2 is a view showing a functional configuration of a relay section.

FIG. 2 is a view showing a functional configuration of the relay section 20. The relay section 20 has a process control section 30, a buffer section 200, a timing storing section 210, a condition storing section 220, and a polling section 230. As an example of mounting, the buffer section 200, the timing storing section 210, and the condition storing section 220 are mounted by means of a storage medium such as a register and a memory, and the polling section 230 and the process control section 30 are mounted by means of a sequencer. First, in advance of writing a control instruction, a processing function when the control processor 15 writes the timing at which the control instruction should be sent to the test unit 40 to an address assigned to the test unit 40 will be explained. The buffer section 200 sequentially buffers a timing value to be written by the control processor 15 to an address assigned to this relay section 20 and a control instruction to be written by the control processor 15 to an address assigned to the corresponding test unit 40.

In detail, the buffer section 200 sequentially buffers a timing writing command for writing the timing value and a control instruction writing command for writing the control instruction, which are received from the control processor 15. For example, a timing writing command is a set of an address in the address space assigned to the relay section 20 and a timing value to be written to this address. On the other hand, for example, a control instruction writing command is a set of an address in the address space assigned to the test unit 40 and a control instruction to be written to this address.

The timing storing section 210 stores a timing that is received from the control processor 15 and at which a control instruction should be sent to the test unit 40. This timing is stored by a buffer control section 35 as a timing value according to a timing writing command. The process control section 30 has the buffer control section 35. The buffer control section 35 controls a timing sending a control instruction received next the timing writing command in addition to the storage of the above timing value. In detail, the buffer control section 35 sends the control instruction buffered by the buffer section 200 to the corresponding test unit 40 according to arriving at the timing stored on the timing storing section 210. For example, this timing value is a delay amount or the like by which the next received control instruction is sent lately. In other words, the buffer control section 35 delays a process for the control instruction writing command received later than the timing writing command until arriving at the timing according to fetching the timing writing command from the buffer section 200.

Next, a processing function when the control processor 15 writes a control instruction to an address assigned to the test unit 40 after writing an address of a status register and an expected value within an address space assigned to this test unit 40 in an address assigned to the relay section 20 will be explained. The condition storing section 220 stores an address of a status register showing a state of the test unit 40 and an expected value compared with a value of the status register, which are received from the control processor 15. These address and expected value are stored by the buffer control section 35. That is to say, when acquiring a condition writing command for writing the address of the status register and the expected value from the buffer section 200, the buffer control section 35 stores the address and the expected value on the condition storing section 220.

In addition, an address of a status register may be a number of the status register and the other identification information or the like, in addition to a virtual address in the control processor 15 assigned to the status register.

The polling section 230 repeatedly reads the status registers (one side or both sides of the status register 400 and the status register 410 according to the designation by the control processor 15) designated by the control processor 15 and showing a state of the test unit 40. In detail, the polling section 230 repeatedly issues a reading command of which reading address is the address of the status register (that is to say, an address stored on the condition storing section 220) to the test unit 40 in response to acquiring the condition writing command from the buffer section 200. The process control section 30 sends the control instruction to be processed by the test unit 40 to the test unit 40 after a value of a status register becomes an expected value according to the fact that the value of the read status register becomes the expected value designated by the control processor 15. The control instruction to be processed after the value of the status register becomes the expected value is, e.g., an instruction written by the control instruction writing command received later than the condition writing command. That is to say, the buffer control section 35 sends the control instruction writing command received later than the condition writing command to the test unit 40 according to the fact that the value of the status register becomes the expected value.

Alternatively or additionally, the buffer control section 35 may issue interrupt to the control processor in order to make the control processor send a following control instruction according to the fact that the value of the status register becomes the expected value. This process is valid when a series of test processes seems to be terminated. That is to say, for example, since the buffer control section 35 issues interrupt to the control processor 15 to reboot the control processor 15, it is possible to start the next test from a beginning.

Figure 3:
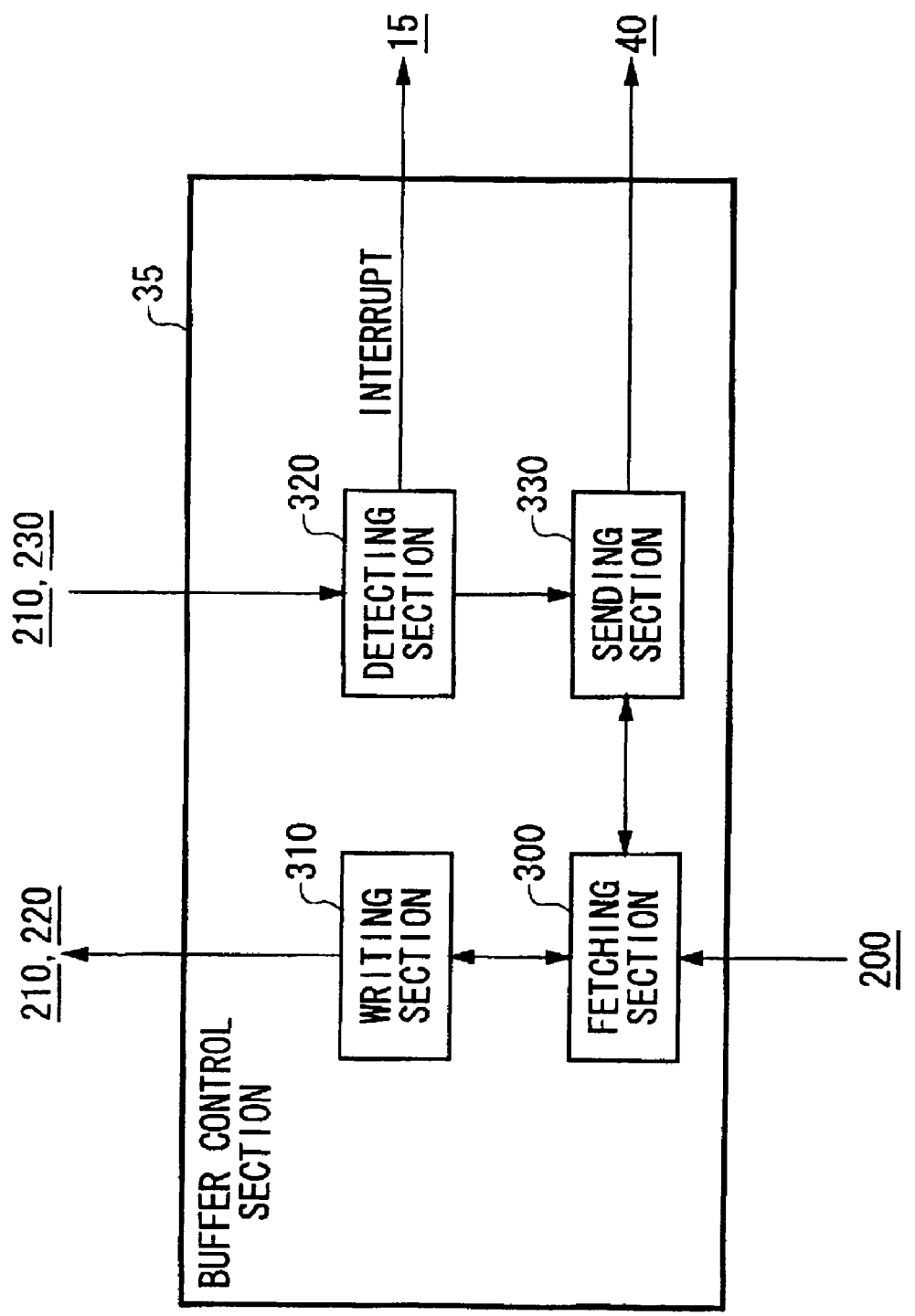
FIG. 3 is a view showing a functional configuration of a buffer control section.

FIG. 3 is a view showing a functional configuration of the buffer control section 35. The buffer control section 35 has a fetching section 300, a writing section 310, a detecting section 320, and a sending section 330. The fetching section 300 sequentially fetches writing commands buffered by the buffer section 200. The fetching section 300 may fetch the writing commands one by one from the head of the buffer section 200 with the FIFO mode according to a notice of writing completion by the writing section 310 or a notice of sending completion by the sending section 330. Moreover, the fetching section 300 may promptly delete a writing command for the relay section 20 from the buffer section 200 after fetching the writing command, and may delete the writing command from the buffer section 200 after completion of a process according to the writing command.

The writing section 310 is an example of a timing writing section according to the present invention, and makes the timing storing section 210 store a timing according to fetching the timing writing command. Moreover, the writing section 310 makes the condition storing section 220 store the address of the status register and the expected value according to fetching the condition writing command. The detecting section 320 detects arrival at the timing stored on the timing storing section 210. Moreover, the detecting section 320 detects whether the value of the status register read by the polling section 230 becomes the expected value.

On condition that the arrival at the timing is detected, the sending section 330 sends the control instruction writing command received later than the timing writing command to the test unit 40. Moreover, on condition that the value of the status register becomes the expected value, the sending section 330 sends the control instruction writing command received later than the condition writing command to the test unit 40.

Figure 4:
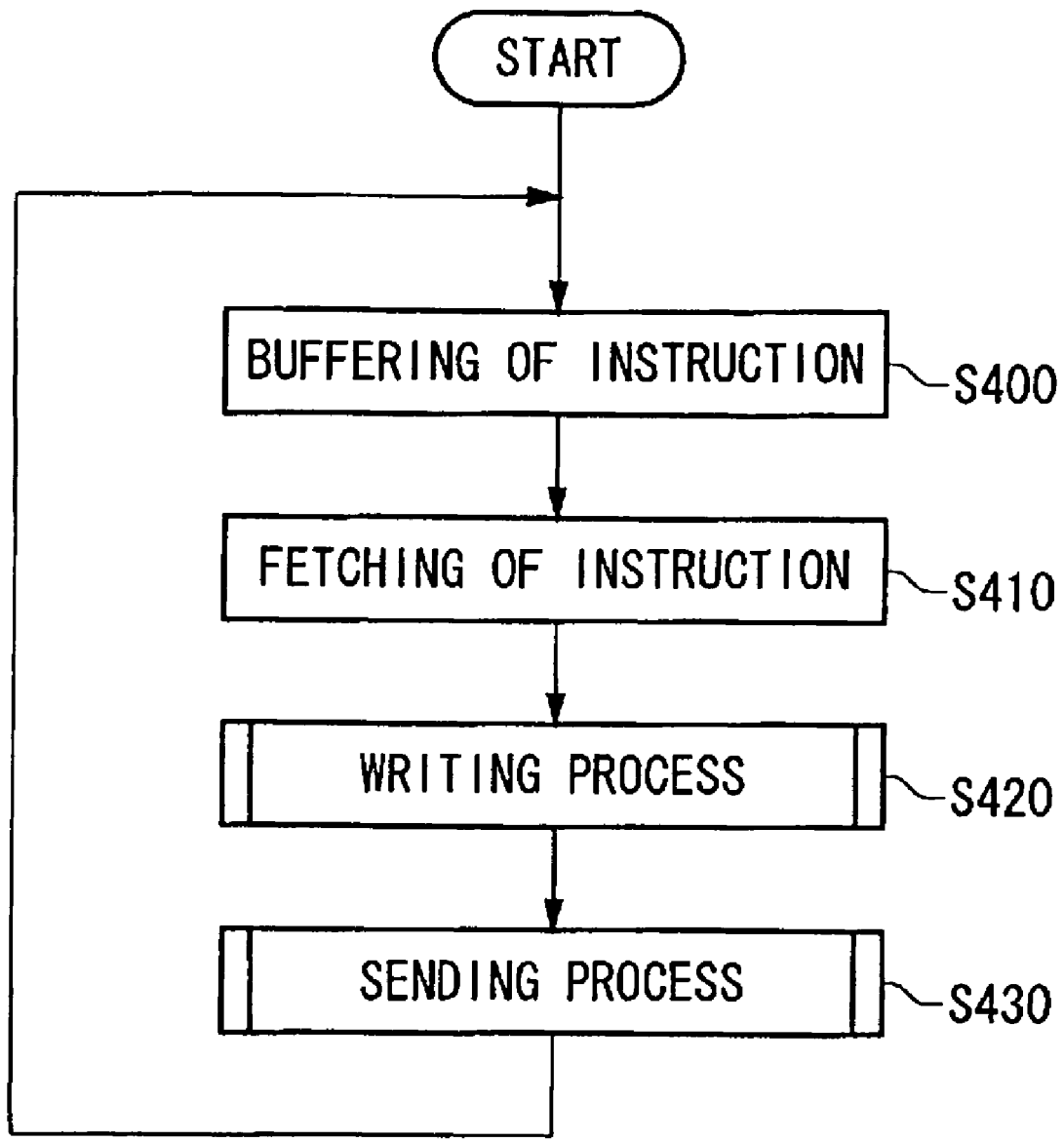
FIG. 4 is a view showing a flow of a process for relaying an instruction from a control processor to a test unit by means of a relay section.

FIG. 4 is a view showing a flow of a process for relaying an instruction from the control processor 15 to the test unit 40 by means of the relay section 20. The buffer section 200 buffers a control instruction to be written by the control processor 15 to an address assigned to the test unit 40 or this relay section 20 (S400). The fetching section 300 sequentially fetches the writing commands buffered by the buffer section 200 (S410). When the taken-out writing command is a writing command for an address space assigned to this relay section 20, the relay section 20 performs writing on the timing storing section 210 or the condition storing section 220 (S420). When the taken-out writing command is a writing command for the addresses of the status registers 400 and 410 in the test unit 40, the relay section 20 performs a sending process for the control instruction (S430).

Figure 5:
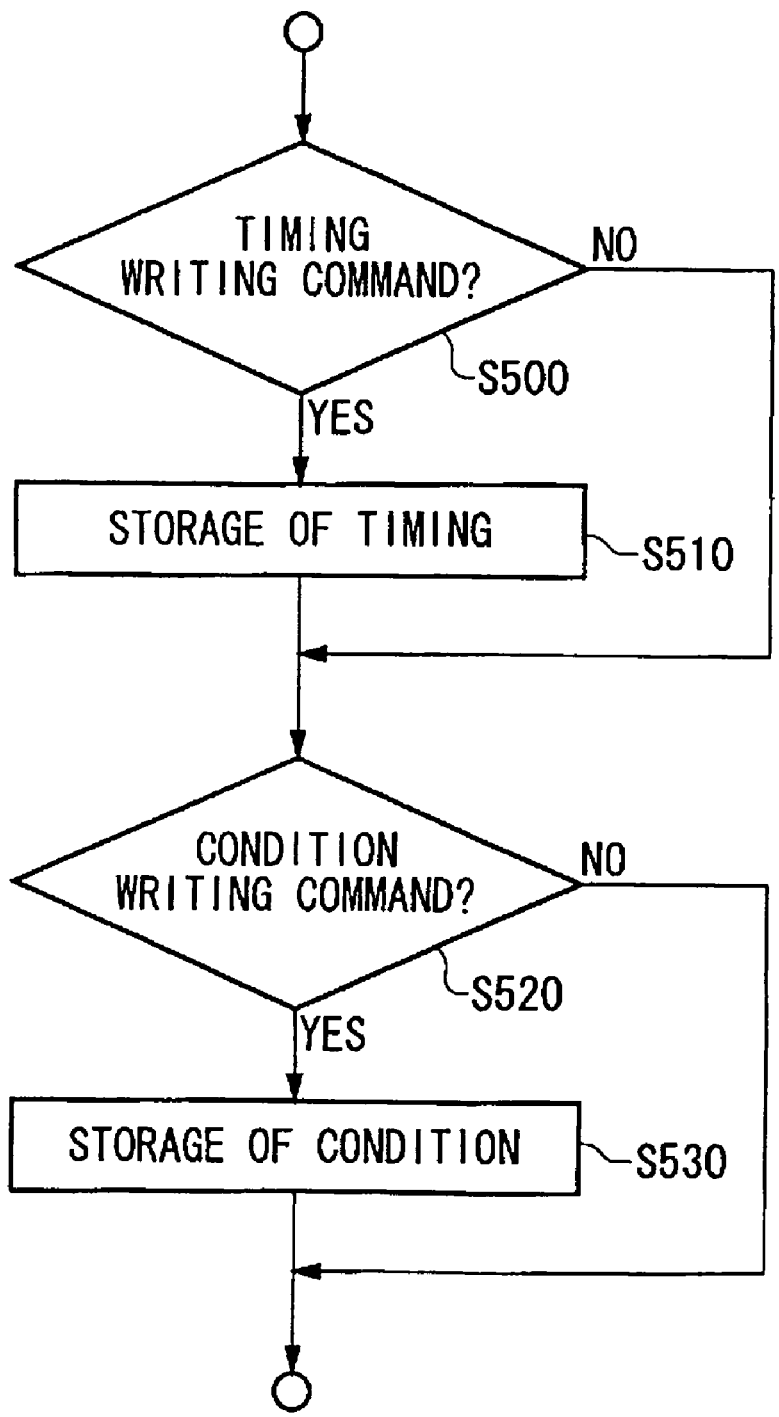
FIG. 5 is a view showing details of a process in S420 shown in FIG. 4.

FIG. 5 is a view showing details of a process in S420 shown in FIG. 4. The writing section 310 judges whether the taken-out command is the timing writing command or not (S500). When it is the timing writing command (S500: YES), the timing designated by the timing writing command is stored on the timing storing section 210 by the writing section 310 (S510). When it is the condition writing command (S520: YES), a condition for sending the following control instruction, i.e., the address of the status register and the expected value are stored on the condition storing section 220 by the writing section 310 (S530).

Figure 6:
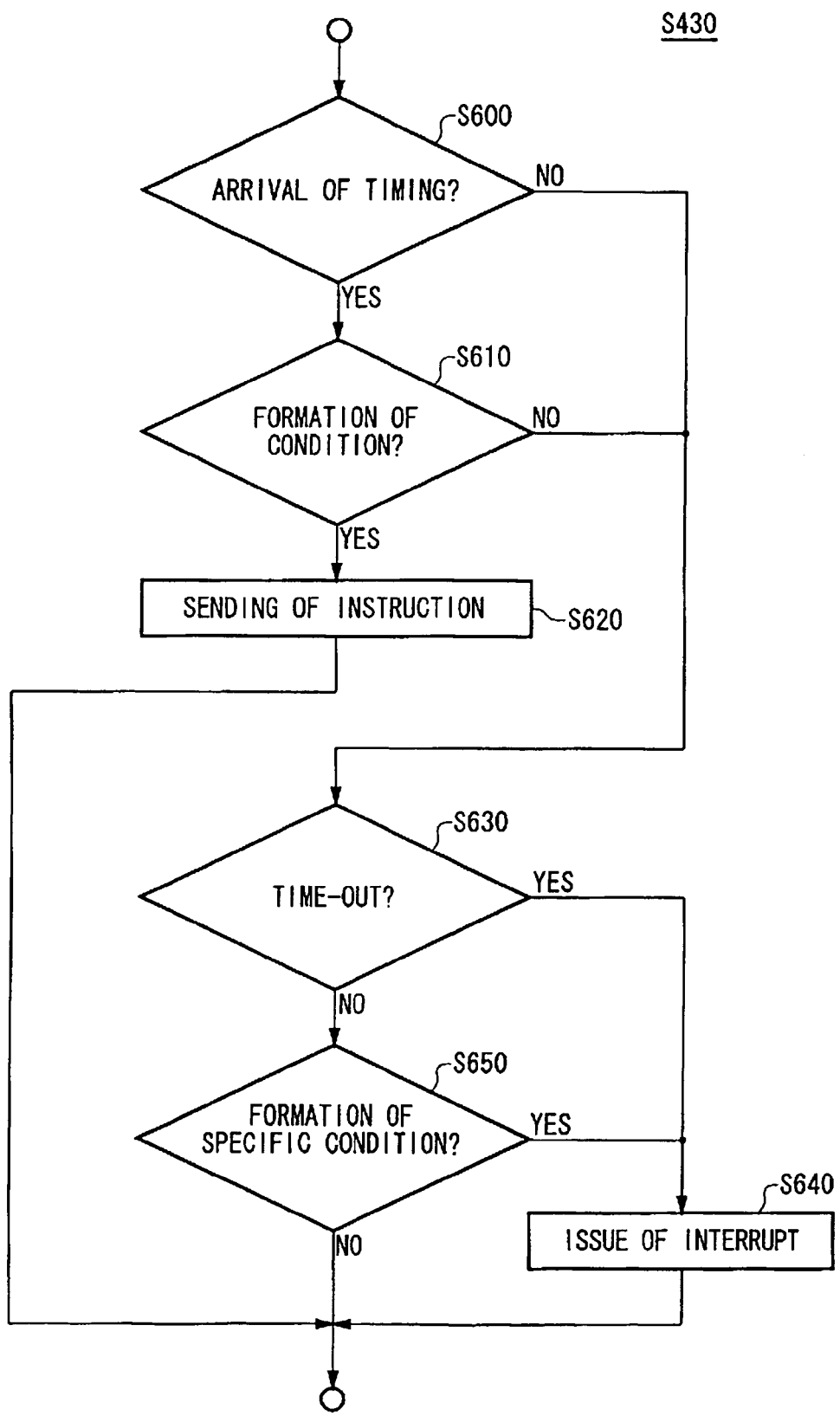
FIG. 6 is a view showing details of a process in S430 shown in FIG. 4.

FIG. 6 is a view showing details of a process in S430 shown in FIG. 4. The detecting section 320 detects arrival at the timing stored on the timing storing section 210 (S600). When arrival at the timing is detected or the timing is not primarily set (S600: YES), the detecting section 320 judges whether the value of the status register becomes the expected value designated by the control processor 15 (S610). In this judgment, the value of the status register may be used for the judgment after being masked by a predetermined masking value in a bit unit. Specifically, it is as follows.

First, when writing an address of a status register and an expected value, the control processor 15 writes, as the expected value, a masking value designating whether each bit of the value of the status register read from the polling section 230 is masked or not and an after-masking expected value showing a value to be satisfied by a value of the masked status register to the condition storing section 220. Then, in addition to reading the value of the status register, the polling section 230 judges whether the value masked by the masking value from the value of the status register becomes the after-masking expected value or not.

Then, according to the fact that arrival at the timing is detected and the value of the status register becomes the expected value (S600: YES, S610: YES), the detecting section 320 in the buffer control section 35 sends the control instruction writing command received later than the condition writing command or the timing writing command to the test unit 40 (S620). In addition, when the masking value is designated in the status register, it becomes a condition that the masked value becomes the after-masking expected value.

When arrival at the timing is not detected or the value of the status register does not become the expected value, the process control section 30 judges whether a preset time-out time after acquiring the condition writing command from the buffer section 200 is passed (S630). When it is passed (S630: YES), the process control section 30 issues time-out interrupt to the control processor 15 (S640). In this way, even when a condition in not set due to the generation of a failure or the like after setting the condition or a condition is not set due to an error of the set condition, it is possible to appropriately start a detection process of an error and the next test.

In order to erase contents in the buffer section 200 to be able to rightly start the next process, the control processor 15 receiving this interrupt may issue an instruction for erasing the contents in the buffer section 200 to the relay section 20. In this case, when receiving this instruction, the relay section 20 erases the writing command within the buffer section 200 without buffering the instruction in the buffer section 200. As further another example, the control processor 15 may issue an instruction for reading the contents in the buffer section 200 to the relay section 20. In this case, when receiving this instruction, the relay section 20 reads the writing command from the buffer section 200 to send the command to the control processor 15 without buffering the instruction in the buffer section 200. It is possible to improve the efficiency of restoration and a close inquiry on a cause after an error generation by mounting these structures.

Moreover, the process control section 30 judges whether a specific condition is accomplished, e.g., a value of a predetermined specific status register becomes an expected value (S650). For example, the state that the value of this status register becomes the expected value is a state showing that a series of tests by the test apparatus 10 have been terminated. In this case (S650: YES), in order to make the control processor 15 send the following control instruction, i.e., the control instruction for the next test, the process control section 30 issues interrupt to the control processor 15 (S640).

Figure 7:
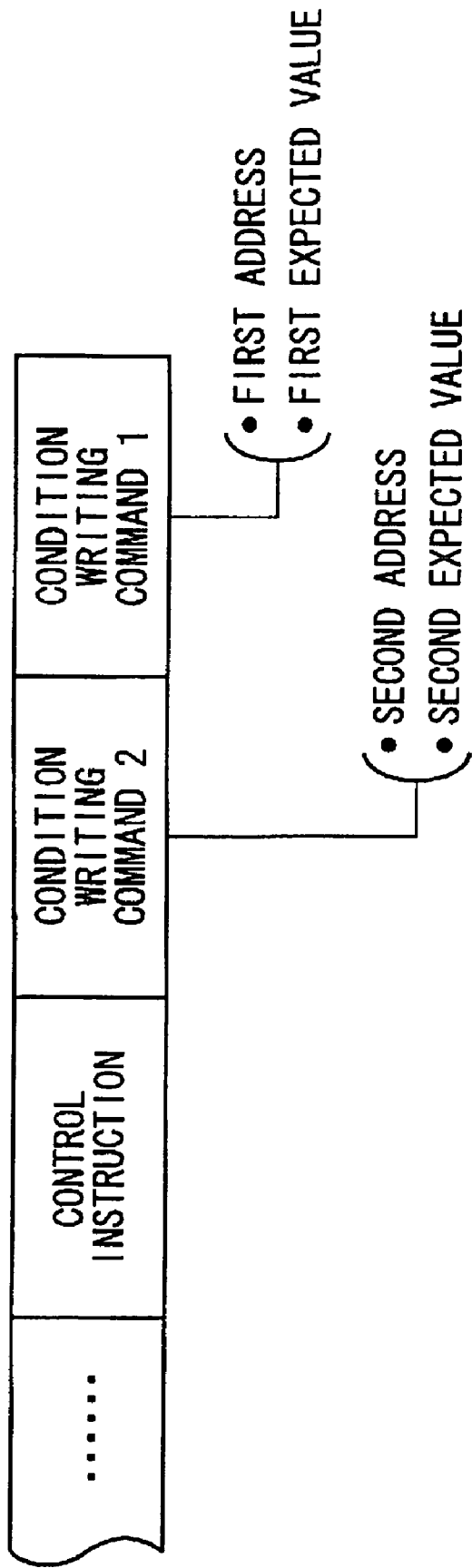
FIG. 7 is a view showing the first example of an instruction group buffered by a buffer section.

FIG. 7 is a view showing the first example of an instruction group buffered by the buffer section 200. By means of the first example, it will be explained an example for setting a plurality of conditions to be satisfied to execute a control instruction. In the first example, a condition writing command 1 that is a first condition writing command for writing a condition to the status register 400, a condition writing command 2 that is a second condition writing command for writing a condition to the status register 410, and a control instruction for controlling the test unit 40 are sequentially stored on the buffer section 200 with a FIFO mode from the head. The condition writing command 1 consists of a first address to specify the status register 400 in an address space of the control processor 15 and a first expected value to be compared with the status register 400. Moreover, the condition writing command 2 consists of a second address to specify the status register 410 in the address space of the control processor 15 and a second expected value to be compared with the status register 410.

That is to say, on condition that the status register 400 becomes the first expected value and the status register 410 becomes the second expected value, the control processor 15 sequentially writes an address of the status register 400 and the first expected value and an address of the status register 410 and the second expected value to an address assigned to the buffer section 200 when trying to send a control instruction to the test unit 40. After that, the control processor 15 writes the control instruction to an address assigned to the test unit 40. As a result, as shown in FIG. 7, the condition writing command 1, the condition writing command 2, and the control instruction are sequentially stored on the buffer section 200.

When the buffer section 200 is in such a state, the polling section 230 repeatedly issues a first reading command of which reading address is an address of the status register 400 to the test unit 40 according to acquiring the condition writing command 1 for writing the address of the status register 400 and the first expected value from the buffer section 200. Then, the buffer control section 35 fetches the condition writing command 2 for writing the address of the status register 410 and the second expected value from the buffer section 200, which is received later than the condition writing command 1, according to the fact that a value of the status register 400 has become the first expected value.

Then, the polling section 230 repeatedly issues a second reading command of which reading address is an address of the status register 410 to the test unit 40 according to acquiring the condition writing command 2 from the buffer section 200.

Then, the buffer control section 35 sends a control instruction writing command received later than the condition writing command 2 to the test unit 40 according to the fact that a value of the status register 410 has become the second expected value. In this manner, when using the plurality of condition writing commands, it is possible to designate the plurality of conditions to be satisfied to execute the control instruction.

Figure 8:
FIG. 8 is a view showing the second example of an instruction group buffered by the buffer section.

FIG. 8 is a view showing the second example of an instruction group buffered by the buffer section 200. By means of the second example, it will be explained a process for setting a plurality of different conditions to be satisfied to execute a control instruction. In the first example, a timing writing command for determining a timing at which the control instruction should be sent to the test unit 40, a condition writing command for writing a condition to the status register 400, and a control instruction for controlling the test unit 40 are sequentially stored on the buffer section 200 with a FIFO mode from the head.

That is to say, the control processor 15 sequentially issues the timing writing command, the condition writing command, and the control instruction writing command in turn. In such a state, the detecting section 320 detects arrival at a timing written by the timing writing command. When the arrival at the timing is detected, the fetching section 300 fetches the following command, i.e., a condition writing command from the buffer section 200. Then, the polling section 230 repeatedly issues a reading command of which reading address is an address of the status register 400 to the test unit 40 according to acquiring a condition writing command for writing an address of the status register 400 and an expected value from the buffer section 200. Then, the buffer control section 35 sends a control instruction writing command received later than a condition writing command to the test unit 40 according to the fact that a value of the status register 400 has become the expected value. In this manner, the condition to be satisfied to execute the control instruction may be the combination of the plurality of different types of conditions.

Figure 9:
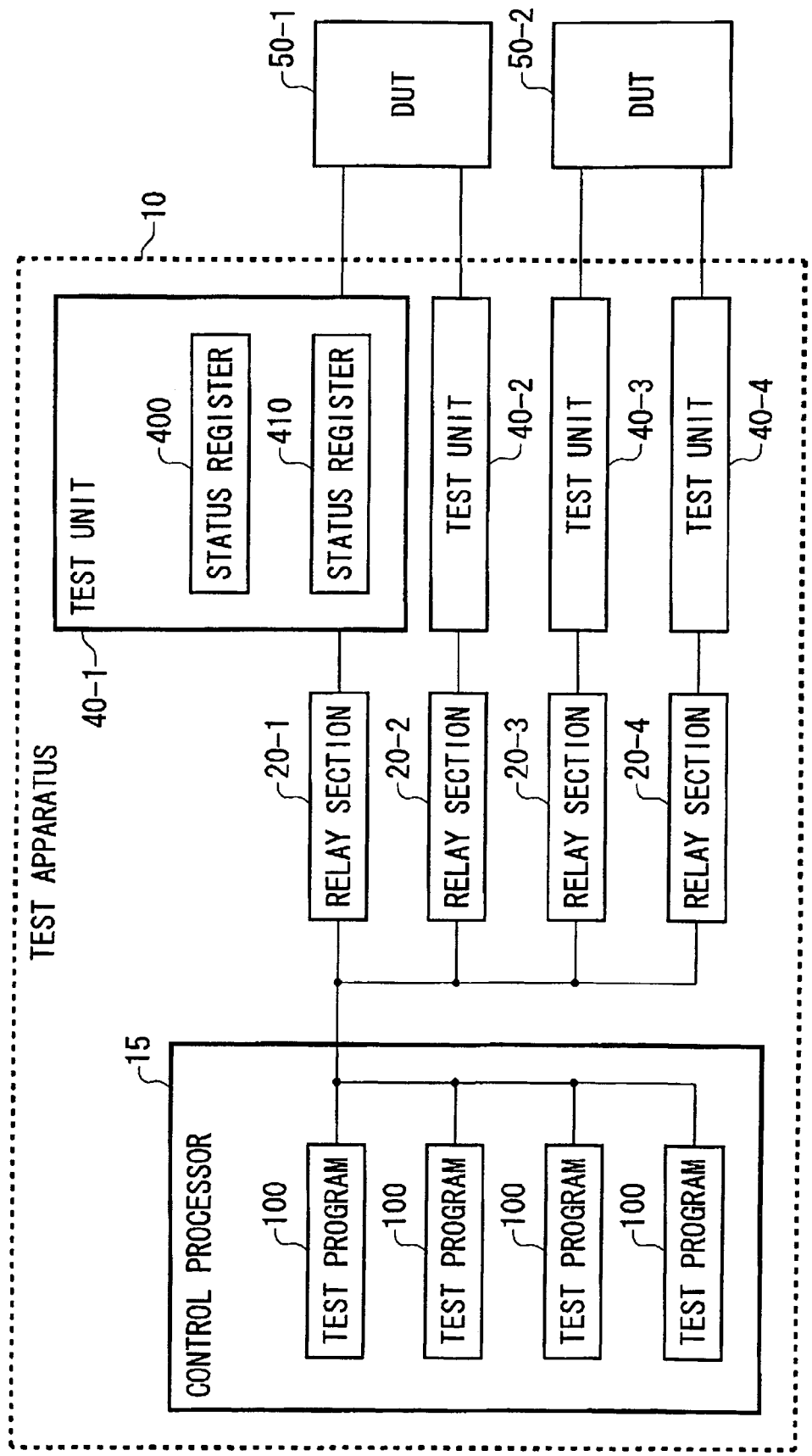
FIG. 9 is a view showing an entire configuration of the test apparatus according to an alternative example of the present embodiment.

FIG. 9 is a view showing an entire configuration of the test apparatus 10 according to an alternative example of the present embodiment. An object of the present alternative example is to test a single device under test 50 by cooperation of the plurality of test units 40. With high performance of the device under test 50, the number of input-output terminals of the device under test 50 increases, and thus one test unit 40 may not test one device under test 50. In such a case, the plurality of test units 40 is respectively connected to a part of the input-output terminals of the device under test 50 to perform a test.

Specifically, the test apparatus 10 according to the present alternative example tests the device under test 50-1 by means of the test unit 40-1 and the test unit 40-2. Moreover, the test apparatus 10 tests the device under test 50-2 by means of the test unit 40-3 and the test unit 40-4. Moreover, each of the relay sections 20-1 to 20-4 is provided in association with each of the test units 40-1 to 40-4. In such a configuration, the relay sections 20-1 and 20-2 may share the same address space in the control processor 15. Moreover, the relay sections 20-3 and 20-4 may share the same address space in the control processor 15. An example of an instruction relaying process in this case will be described with reference to FIG. 10.

In addition, the description is omitted about a configuration except the configuration described with reference to FIG. 9 because the omitted configuration is generally equal to that of the test apparatus 10 according to the embodiment described with reference to FIGS. 1 to 8.

Figure 10:
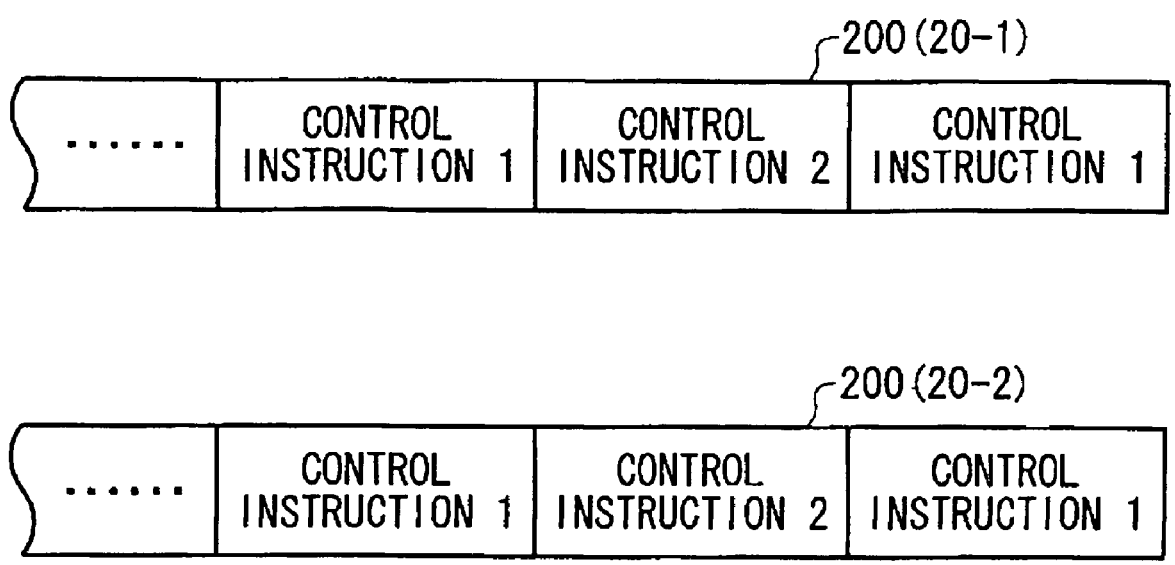
FIG. 10 is a view exemplary showing an instruction group buffered by the buffer section according to an alternative example of the present embodiment.

FIG. 10 is a view exemplary showing an instruction group buffered by the buffer section 200 according to an alternative example of the present embodiment. Since the relay section 20-1 and the relay section 20-2 share the same address space, the same instruction group is buffered in the buffer section 200 in the relay section 20-1 and the buffer section 200 in the relay section 20-2. Specifically, a control instruction 1 for the test unit 40-1, a control instruction 2 for the test unit 40-2, and the control instruction 1 for the test unit 40-1 in turn are sequentially stored on each of the buffer sections 200 from the head.

The fetching section 300 in the relay section 20-1 judges whether a writing point for this control instruction 1 is the test unit 40-1 when fetching the control instruction 1 from the head of the buffer section 200. Since the writing point is the test unit 40-1, the relay section 20-1 sends this control instruction 1 to the test unit 40-1. On the other hand, the fetching section 300 in the relay section 20-2 destroys the control instruction 1 without executing it because the writing point for the control instruction 1 at the head of the buffer section 200 is not the test unit 40-2.

When execution or destruction of the leading control instruction 1 is completed, the relay sections 20-1 and 20-2 advance to a process for the next instruction. That is to say, the buffer section 200 in the relay section 20-1 destroys the control instruction 2 because a writing point for the control instruction 2 is the test unit 40-2 when fetching the control instruction 2. On the other hand, the buffer section 200 in the relay section 20-2 sends the control instruction to the test unit 40-2 because the writing point for the control instruction 2 is the test unit 40-2. it is similar about the following control instruction.

In this manner, according to the present alternative example, although the plurality of test units 40 tests one device under test 50, it is possible to set an address space viewed from the control processor 15 for each of the device under tests 50. In this way, instructions for each of the test units 40 are appropriately divided and processed by the relay section 20. In this manner, according to the present alternative example, since a sorting process for instructions is concentrated on the relay section 20 in addition to a process described in the embodiment shown in FIGS. 1 to 8, it is possible to reduce a load of the control processor 15. Furthermore, it is possible to easily utilize the existing test program 100 and test unit 40.

Although the present invention has been described by way of an exemplary embodiment, it should be understood that those skilled in the art might make many changes and substitutions without departing from the spirit and the scope of the present invention. For example, the relay section 20 shown in the present embodiment or the alternative example may be included and mounted in and to the test unit 40 corresponding to it. It is obvious from the definition of the appended claims that embodiments with such modifications also belong to the scope of the present invention.

As apparent from the above descriptions, according to an exemplary embodiment of the present invention, it is possible to realize a test apparatus and a control method for effectively controlling an operation timing of a test unit with high precision.

What is claimed is:

1. A test apparatus that tests a device under test, comprising:
    a control processor that executes a test program for testing the device under test;
    a test unit that is connected to the device under test and tests the device under test according to an instruction from the control processor; and
    a relay section that is connected to the control processor and the test unit and relays a control instruction sent from the control processor to the test unit, and
    the relay section comprising:
    a polling section that repeatedly reads a status register showing a state of the test unit, which is designated by the control processor; and
    a process control section that sends the control instruction to be processed by the test unit after a value of the status register becomes an expected value to the test unit according to the fact that the value of the status register becomes the expected value designated by the control processor.

2. The test apparatus as claimed in claim 1, wherein
    the control processor writes the expected value and an address of the status register within an address space assigned to the test unit to an address assigned to the relay section and then writes the control instruction to an address assigned to the test unit,
    the relay section further has a buffer section that sequentially buffers a condition writing command for writing the address of the status register and the expected value and a control instruction writing command for writing the instruction command, which are received from the control processor,
    the polling section repeatedly issues a reading command of which reading address is the address of the status register to the test unit in response to acquiring the condition writing command from the buffer section, and
    the process control section comprises a buffer control section that sends the control instruction writing command received later than the condition writing command to the test unit according to the fact that the value of the status register becomes the expected value.

3. The test apparatus as claimed in claim 2, wherein the control processor writes a masking value designating whether each bit of the value of the status register read from the polling section is masked or not and an after-masking expected value showing a value to be satisfied by a value of the masked status register, as the expected value when writing the address of the status register and the expected value, and the buffer control section sends the control instruction writing command received later than the condition writing command to the test unit according to the fact that a value masked from the value of the status register by the masking value becomes the after-masking expected value.

4. The test apparatus as claimed in claim 2, wherein
    the control processor sequentially writes, when the control instruction is sent to the test unit on condition that a first of the status register becomes a first of the expected value and a second of the status register becomes a second of the expected value, an address of the first status register and a first expected value and an address of the second status register and a second expected value to an address assigned to the relay section and then writes the control instruction to an address assigned to the test unit,
    the polling section repeatedly issues a first reading command of which reading address is the address of the first status register to the test unit in response to acquiring a first of the condition writing command for writing the address of the first status register and the first expected value from the buffer section,
    the buffer control section fetches a second of the condition writing command, which is received later than the first condition writing command, for writing the address of the second status register and the second expected value from the buffer section according to the fact that a value of the first status register becomes the first expected value,
    the polling section repeatedly issues a second reading command of which reading address is the address of the second status register to the test unit in response to acquiring the second condition writing command from the buffer section, and
    the buffer control section sends the control instruction writing command received later than the second condition writing command to the test unit according to the fact that a value of the second status register becomes the second expected value.

5. The test apparatus as claimed in claim 1, wherein the process control section issues time-out interrupt to the control processor according to the elapse of a preset time-out time after the acquirement of the condition writing command from the buffer section.

6. The test apparatus as claimed in claim 1, wherein the process control section issues interrupt to the control processor in order to make the control processor send a following control instruction according to the fact that the value of the status register becomes the expected value designated by the control processor.

7. A control method for controlling a test apparatus, the test apparatus comprising:
    a control processor that executes a test program for testing a device under test; and a test unit that is connected to the device under test and tests the device under test according to an instruction from the control processor, and the control method comprising:

repeatedly reading a status register showing a state of the test unit, which is designated by the control processor; and sending a control instruction to be processed by the test unit after a value of the status register becomes an expected value to the test unit according to the fact that the value of the status register becomes the expected value designated by the control processor.

* * * * *